United States Patent
Chou et al.

(10) Patent No.: US 10,324,739 B2
(45) Date of Patent: Jun. 18, 2019

(54) SYSTEMS AND METHODS FOR SIMULATED APPLICATION OF COSMETIC EFFECTS

(71) Applicant: Perfect Corp., New Taipei (TW)

(72) Inventors: Chen-Wei Chou, New Taipei (TW); Ching-Hsuan Ma, Taichung (TW)

(73) Assignee: PERFECT CORP., New Taipei (TW)

( * ) Notice: Subject to any disclaimer, the term of this patent is extended or adjusted under 35 U.S.C. 154(b) by 171 days.

(21) Appl. No.: 15/446,301

(22) Filed: Mar. 1, 2017

(65) Prior Publication Data
US 2017/0255478 A1    Sep. 7, 2017

Related U.S. Application Data

(60) Provisional application No. 62/303,051, filed on Mar. 3, 2016.

(51) Int. Cl.
  *G06F 3/00* (2006.01)
  *G06F 9/451* (2018.01)
  (Continued)

(52) U.S. Cl.
  CPC .............. *G06F 9/453* (2018.02); *G06F 3/011* (2013.01); *G06F 3/012* (2013.01);
  (Continued)

(58) Field of Classification Search
  CPC ..... G06T 19/00; G06T 19/006; G06T 11/001; A45D 44/005; G06K 9/00248; G06F 9/453
  (Continued)

(56) References Cited

U.S. PATENT DOCUMENTS

| | | |
|---|---|---|
| 6,502,583 B1 | 1/2003 | Utsugi |
| 2007/0019882 A1 | 1/2007 | Tanaka et al. |

(Continued)

FOREIGN PATENT DOCUMENTS

| | | |
|---|---|---|
| CN | 101673475 B | 3/2010 |
| JP | 2001216386 A | 8/2001 |

(Continued)

OTHER PUBLICATIONS

"28 Before and Afters That Show the Transformative Power of Makeup" by Tanner Greenring, Jul. 30, 2014 downloaded from on Oct. 15, 2018 https://www.buzzfeed.conn/awesomer/makeup-before-and-afters?utm_term=.IIxEJaRPo#.ei0NOVAIR (Year: 2014).*

(Continued)

*Primary Examiner* — Andrey Belousov
(74) *Attorney, Agent, or Firm* — McClure, Qualey & Rodack, LLP

(57) ABSTRACT

In a computing device for simulating the application of cosmetic effects, a user interface with a plurality of cosmetic templates is displayed to a user, where each cosmetic template comprises a predefined sequence for applying cosmetic effects. A selection of one of the cosmetic templates is obtained from the user, and a digital representation of the user is captured. The computing device tracks facial features of the user in the digital representation of the user and generates a virtual mirror for the user to view. The virtual mirror displays progressive application of each of the sequence of cosmetic effects of the selected cosmetic template to corresponding facial features in the digital representation. A digital representation of the simulated application of all of the sequence of cosmetic effects is then stored.

18 Claims, 13 Drawing Sheets

(51) Int. Cl.
- *G06T 11/00* (2006.01)
- *G06F 3/01* (2006.01)
- *G06F 3/0484* (2013.01)
- *G06F 17/50* (2006.01)
- *G06Q 30/06* (2012.01)

(52) U.S. Cl.
CPC ...... *G06F 3/04842* (2013.01); *G06F 17/5009* (2013.01); *G06Q 30/06* (2013.01); *G06T 11/001* (2013.01); *G06F 2203/04803* (2013.01)

(58) Field of Classification Search
USPC .................................................. 715/706, 709
See application file for complete search history.

(56) References Cited

U.S. PATENT DOCUMENTS

| | | |
|---|---|---|
| 2012/0044335 A1 | 2/2012 | Goto |
| 2012/0223956 A1* | 9/2012 | Saito .................. A45D 44/005 345/582 |
| 2013/0111337 A1 | 5/2013 | Deng et al. |
| 2015/0086945 A1 | 3/2015 | Yamanashi et al. |
| 2015/0118655 A1 | 4/2015 | Yamanashi et al. |

FOREIGN PATENT DOCUMENTS

| | | |
|---|---|---|
| JP | 2002092132 A | 3/2002 |
| JP | 2014191813 A | 10/2014 |
| KR | 20140061604 A | 5/2014 |
| TH | 82235 | 1/2007 |
| WO | 2008102440 A1 | 8/2008 |
| WO | 2011085727 A8 | 7/2011 |
| WO | 2014118842 A1 | 8/2014 |
| WO | 2015127394 A1 | 8/2015 |

OTHER PUBLICATIONS

"How to use Picture-In-Picture (PIP)" by Bell Satellite downloaded Oct. 15, 2018 from https://web.archive.org/web/20121015125517/https://support.bell.ca/TV/Receivers/How_to_use_Picture_In_Picture (Year: 2010).*

Makeup Premium. https://play.google.com/store/apps/details?id=com.modiface.makeup.vmpro. 2014.

Perfect 365-One-Tap Makeover. https://itunes.apple.com/in/app/perfect365-one-tap-makeover/id475976577?mt=8. 2014.

Cuccinelli, Jamie. "The Benefit Brow Genie App Grants Your Wish for Perfect Brows Instantly" https://www.bustle.com/articles/83661-the-benefit-brow-genie-app-grants-your-wish-for-perfect-brows-instantly. May 15, 2015.

Plum Perfect by ColorModules Inc. https://itunes.apple.com/us/app/plum-perfect/id544889292?mt=8. 2015.

Lakmé Make-Up Pro App. https://play.google.com/store/apps/details?id=com.modiface.lakme.makeuppro&hl=en. Jun. 18, 2015.

Makeup Express. SecretsI.D. Makeup and Beauty Blog. http://en.secretsid.com/new-maybelline-app-for-smartphones/. Aug. 27, 2013.

Makeup Genius. https://play.google.com/store/apps/details?id=com.imagemetrics.lorealparisandroid&hl=en. Jun. 16, 2015.

Makeup Designs—Learn to Apply Makeup Like a Pro, https://itunes.apple.com/us/app/makeup-designs-learn-how-to/id568405095?mt=8. Jan. 19, 2015.

Youcam Makeup—Makeover Studio, https://play.google.com/store/apps/details?id=com.cyberlink.youcammakeup. Aug. 5, 2015.

* cited by examiner (MAKEUP EFFECT 1, STEP 1 OF 6)

CURRENT VIEW:
PROFESSIONALLY APPLIED MAKEUP

SHOW ACTUAL APPLICATION BY USER

CURRENT VIEW:
USER APPLIED MAKEUP

SHOW PROFESSIONAL APPLICATION

SYSTEMS AND METHODS FOR SIMULATED APPLICATION OF COSMETIC EFFECTS

CROSS-REFERENCE TO RELATED APPLICATION

This application claims priority to, and the benefit of, U.S. Provisional Patent Application entitled, "Systems and Methods for Application of Cosmetic Products," having Ser. No. 62/303,051, filed on Mar. 3, 2016, which is incorporated by reference in its entirety.

TECHNICAL FIELD

The present disclosure generally relates to makeup application and more particularly, to systems and methods for providing step-by-step directions for the application of makeup.

BACKGROUND

Individuals invest a substantial amount of money in makeup tools and accessories. However, it can be challenging to achieve the same results as a makeup professional even with the aid of conventional self-help guides.

SUMMARY

In a computing device for simulating the application of cosmetic effects, a user interface with a plurality of cosmetic templates is displayed to a user, where each cosmetic template comprises a predefined sequence for applying cosmetic effects. A selection of one of the cosmetic templates is obtained from the user, and a digital representation of the user is captured. The computing device tracks facial features of the user in the digital representation of the user and generates a virtual mirror for the user to view. The virtual mirror displays progressive application of each of the sequence of cosmetic effects of the selected cosmetic template to corresponding facial features in the digital representation. A digital representation of the simulated application of all of the sequence of cosmetic effects is then stored.

Another embodiment is a system that comprises a memory storing instructions and a processor coupled to the memory. The processor is configured by the instructions to display a user interface with a plurality of cosmetic templates to a user, where each cosmetic template comprises a predefined sequence for applying cosmetic effects. The processor is further configured to obtain a selection of one of the cosmetic templates from the user, capture a digital representation of the user, and track facial features of the user in the digital representation of the user. The processor is further configured to generate a virtual mirror for the user to view, the virtual mirror displaying progressive application of each of the sequence of cosmetic effects of the selected cosmetic template to corresponding facial features in the digital representation. The processor is further configured to store a digital representation of the simulated application of all of the sequence of cosmetic effects.

Another embodiment is a non-transitory computer-readable storage medium storing instructions to be implemented by a computing device having a processor, wherein the instructions. When executed by the processor, the instructions on the non-transitory computer-readable storage medium cause the computing device to display a user interface with a plurality of cosmetic templates to a user, each cosmetic template comprising a predefined sequence for applying cosmetic effects. The processor is further configured to obtain a selection of one of the cosmetic templates from the user, capture a digital representation of the user, and track facial features of the user in the digital representation of the user. The processor is further configured to generate a virtual mirror for the user to view, the virtual mirror displaying progressive application of each of the sequence of cosmetic effects of the selected cosmetic template to corresponding facial features in the digital representation. The processor is further configured to store a digital representation of the simulated application of all of the sequence of cosmetic effects.

BRIEF DESCRIPTION OF THE DRAWINGS

Various aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
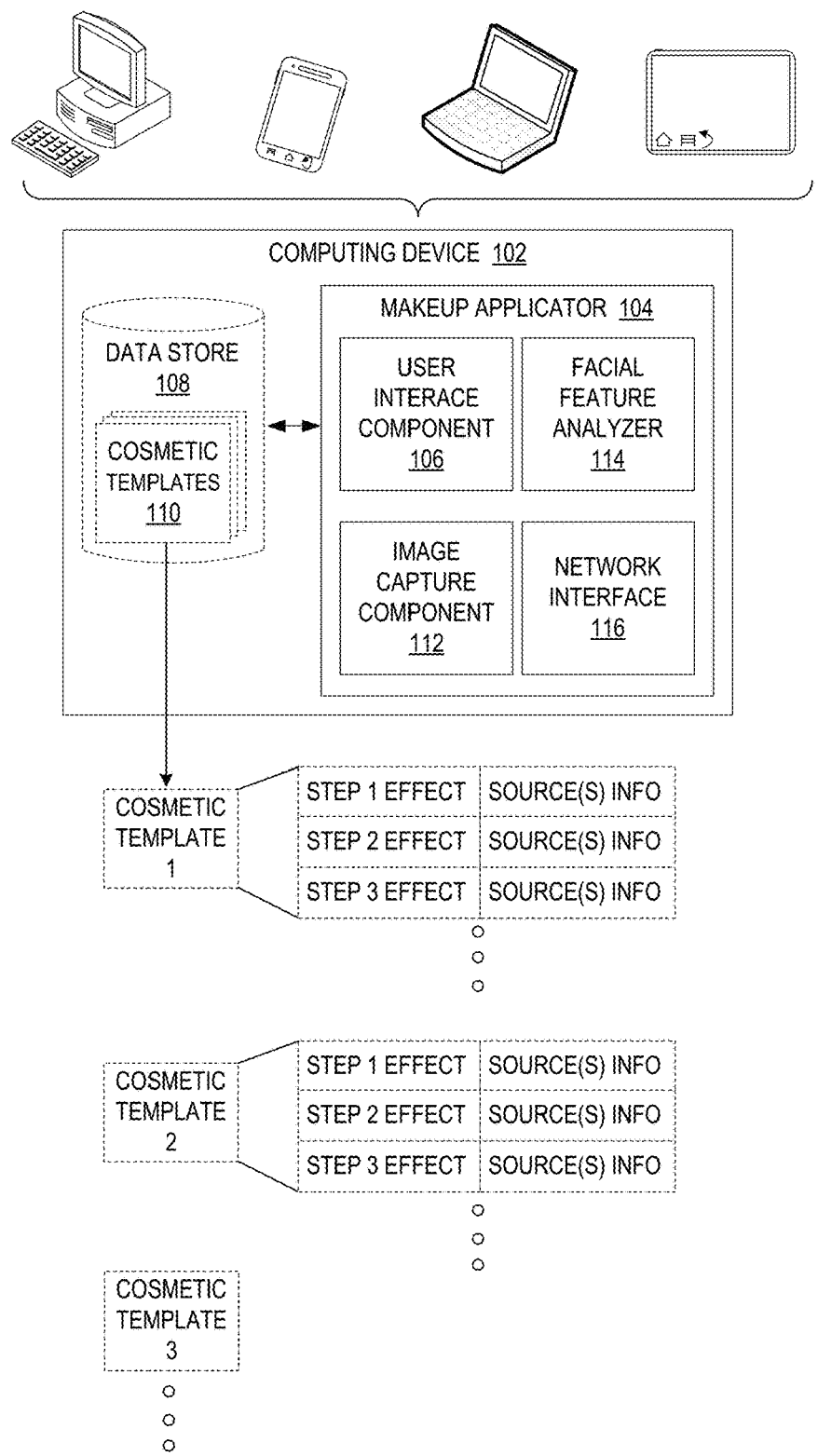
FIG. 1 is a block diagram of a computing device in which the disclosed makeup application features may be implemented in accordance with various embodiments.

In conventional makeup guidance setups, an individual typically utilizes a mirror and applies makeup in a specific order. Normally, the specific order in which the makeup is applied is essential as certain makeup steps are simply not interchangeable. That is, some makeup results rely on the process of superimposing one makeup effect onto another. If the specific order is altered, it may become difficult to achieve the desired layered cosmetic effect.

Many times, it can be difficult to envision or anticipate how a final makeup result will appear until all the makeup products are actually applied. For example, if an individual applies a less than optimal eye shadow color, the individual might not realize that another eye shadow color would have resulted in a more desirable outcome until artificial eyelashes have been put on and mascara has been applied onto the eyelashes (which is usually the last step of the makeup process). In this example scenario, if the individual wishes to redo that particular makeup step, the individual must remove the artificial eyelashes, remove the previously-applied eye shadow color, apply another eye shadow color, put on another pair of artificial eyelashes, and re-apply mascara. Significantly, the individual does not know if the new eye shadow color will produce the desired look until all the makeup steps are again completed.

Various embodiments are disclosed for systems and methods for facilitating the application of makeup to achieve a desired makeup effect. As described in more detail below, the makeup system includes a virtual mirror feature whereby the user is able view a digital representation of the user during a specifically sequenced application of cosmetics onto the digital representation of the user. In some implementations, the virtual mirror effect is achieved through the use of a front-facing camera on a computing device. The user views the captured digital representation while the system simulates the application of cosmetic effects to the digital representation of the user's face. The virtual mirror feature facilitates the step-by-step instruction process and allows the user to view the simulated application of makeup in real time.

In accordance with some embodiments, the user can view the virtual mirror as the system simulates the application of cosmetic effects selected by the user. For example, when the individual applies eye shadow, the virtual mirror will display a digital eyelashes effect superimposed on a digital representation of the individual's face so that the individual can actually preview the final result with that particular eye shadow effect. This facilitates the individual's selection process and allows the individual to effortlessly test out different eye shadow colors. Furthermore, the application of eye shadow may involve the application of multiple shades/effects. Thus, the use of a virtual mirror allows the individual to digitally superimpose multiple shades/colors of eye shadow onto previous effect(s)/color(s) that have already been applied. As another example application, the virtual mirror may be utilized to show different lipstick colors on the individual's lip, thereby allowing the individual to select a color without having to actually apply different lipstick colors.

Various embodiments further facilitate the makeup application process by supplying the user with details on where the user may obtain the particular makeup being applied at each step in the application sequence. Various embodiments further include the ability for multiple users to undergo the step-by-step guidance together and interact during the application of makeup.

A description of a system for facilitating makeup application is now described followed by a discussion of the operation of the components within the system. FIG. 1 is a block diagram of a computing device 102 in which the makeup application features disclosed herein may be implemented. The computing device 102 may be embodied as a computing device 102 equipped with digital content recording capabilities, where the computing device 102 may include, but is not limited to, a digital camera, a smartphone, a tablet computing device 102, a digital video recorder, a laptop computer coupled to a webcam, and so on. The computing device 102 is configured to retrieve a digital representation of the user, wherein the digital representation can comprises a still image or live video of the user.

As one of ordinary skill will appreciate, the digital media content may be encoded in any of a number of formats including, but not limited to, JPEG (Joint Photographic Experts Group) files, TIFF (Tagged Image File Format) files, PNG (Portable Network Graphics) files, GIF (Graphics Interchange Format) files, BMP (bitmap) files or any number of other digital formats. The digital media content may be encoded in other formats including, but not limited to, Motion Picture Experts Group (MPEG)-1, MPEG-2, MPEG-4, H.264, Third Generation Partnership Project (3GPP), 3GPP-2, Standard-Definition Video (SD-Video), High-Definition Video (HD-Video), Digital Versatile Disc (DVD) multimedia, Video Compact Disc (VCD) multimedia, High-Definition Digital Versatile Disc (HD-DVD) multimedia, Digital Television Video/High-definition Digital Television (DTV/HDTV) multimedia, Audio Video Interleave (AVI), Digital Video (DV), QuickTime (QT) file, Windows Media Video (WMV), Advanced System Format (ASF), Real Media (RM), Flash Media (FLV), an MPEG Audio Layer III (MP3), an MPEG Audio Layer II (MP2), Waveform Audio Format (WAV), Windows Media Audio (WMA), or any number of other digital formats.

A makeup applicator 104 executes on a processor of the computing device 102 and configures the processor to perform various operations relating to the application of makeup. The makeup applicator 104 includes a user interface component 106 configured to render user interfaces to the user for purposes of receiving a desired cosmetic template selection. The user interfaces generated by the user interface component 106 also provides the user with step-by-step instructions during the makeup application process. These step-by-step instructions can comprise one or more of the following: text displayed on portions of the user's face, annotation, animation, step-by-step directions, information relating to color intensity of one of more of the cosmetic effects within the sequence of cosmetic effects, and text describing target facial regions for applying each of the sequence of cosmetic effects.

The user interface component 106 is coupled to a data store 108 containing a plurality of predefined cosmetic templates 110 that the user can select from. Each cosmetic template 110 in the data store 108 provides a different look achieved through a combination of cosmetics and/or different sequences in which the cosmetics are applied. As shown, each cosmetic template 110 comprises one or more predefined steps for applying a particular makeup. In one example, the cosmetic template 110 can correspond to application of a single cosmetic effect (e.g., lipstick). In other instances, the cosmetic template 110 can correspond to the application of a plurality of cosmetic effects. Source information may include retailer information specifying where the makeup being applied at a particular step may be obtained.

The makeup applicator 104 also includes an image capture component 112 configured to obtain digital representations comprising still image(s) and/or live video of the user. The facial feature analyzer 114 receives the digital media content obtained by the image capture component 112 and analyzes facial features for purposes of later applying a sequence of cosmetic effects to specific regions of the user's face. Where the user elects to use a live video, the facial feature analyzer 114 tracks the identified facial features across frames of the video.

The makeup applicator 104 may also include a network interface 116 that allows the computing device 102 to be coupled to a network such as, for example, the Internet, intranets, extranets, wide area networks (WANs), local area networks (LANs), wired networks, wireless networks, or other suitable networks, etc., or any combination of two or more such networks. Through the network, the computing device 102 may be communicatively coupled to other computing devices 102, as described in more detail below.

Figure 2:
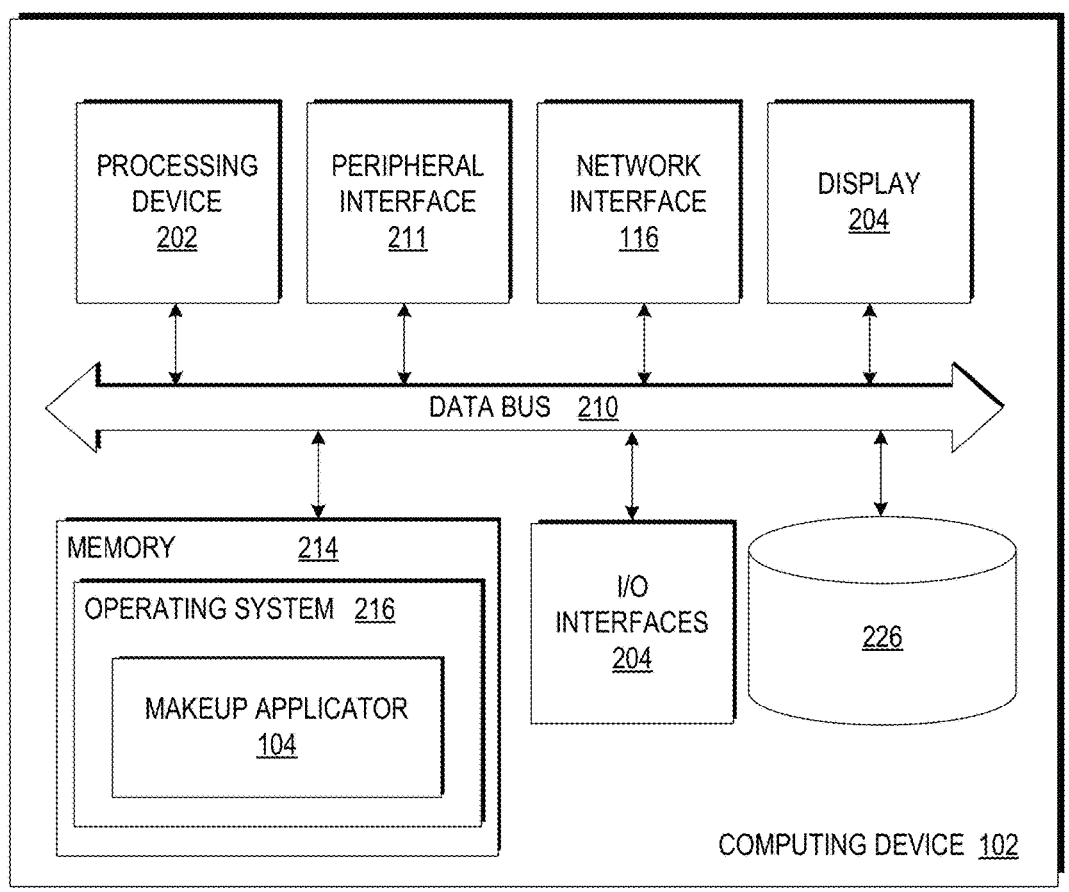
FIG. 2 illustrates a schematic block diagram of the computing device in FIG. 1 in accordance with various embodiments.

FIG. 2 illustrates a schematic block diagram of the computing device 102 in FIG. 1. The computing device 102 may be embodied in any one of a wide variety of wired and/or wireless computing devices 102, such as a desktop computer, portable computer, dedicated server computer, multiprocessor computing device 102, smart phone, tablet, and so forth. As shown in FIG. 2, each of the computing device 102 comprises memory 214, a processing device 202, a number of input/output interfaces 204, a network interface 116, a display 203, a peripheral interface 211, and mass storage 226, wherein each of these components are connected across a local data bus 210.

The processing device 202 may include any custom made or commercially available processor, a central processing unit (CPU) or an auxiliary processor among several processors associated with the computing device 102, a semiconductor based microprocessor (in the form of a microchip), a macroprocessor, one or more application specific integrated circuits (ASICs), a plurality of suitably configured digital logic gates, and other well known electrical configurations comprising discrete elements both individually and in various combinations to coordinate the overall operation of the computing system.

The memory 214 can include any one of a combination of volatile memory elements (e.g., random-access memory (RAM, such as DRAM, and SRAM, etc.)) and nonvolatile memory elements (e.g., ROM, hard drive, tape, CDROM, etc.). The memory 214 typically comprises a native operating system 216, one or more native applications, emulation systems, or emulated applications for any of a variety of operating systems and/or emulated hardware platforms, emulated operating systems, etc. For example, the applications may include application specific software which may comprise some or all the components of the computing device 102 depicted in FIG. 1. In accordance with such embodiments, the components are stored in memory 214 and executed by the processing device 202. One of ordinary skill in the art will appreciate that the memory 214 can, and typically will, comprise other components which have been omitted for purposes of brevity.

Input/output interfaces 204 provide any number of interfaces for the input and output of data. For example, where the computing device 102 comprises a personal computer, these components may interface with one or more user input/output interfaces 204, which may comprise a keyboard or a mouse, as shown in FIG. 2. The display 203 may comprise a computer monitor, a plasma screen for a PC, a liquid crystal display (LCD) on a hand held device, a touchscreen, or other display device.

In the context of this disclosure, a non-transitory computer-readable medium stores programs for use by or in connection with an instruction execution system, apparatus, or device. More specific examples of a computer-readable medium may include by way of example and without limitation: a portable computer diskette, a random access memory (RAM), a read-only memory (ROM), an erasable programmable read-only memory (EPROM, EEPROM, or Flash memory), and a portable compact disc read-only memory (CDROM) (optical).

Figure 3:
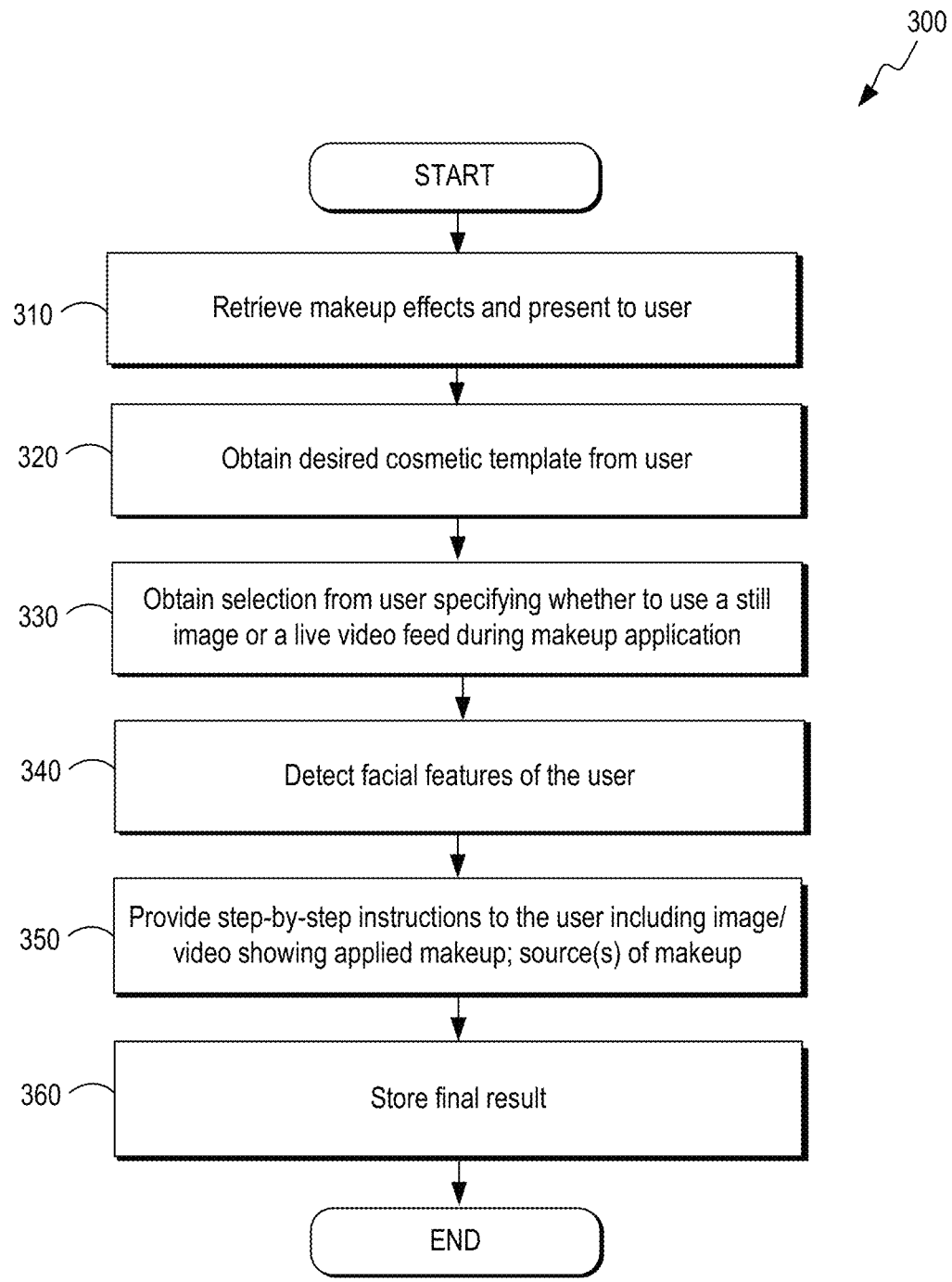
FIG. 3 is a flowchart for simulating application of makeup performed by the computing device of FIG. 1 in accordance with various embodiments.

Reference is made to FIG. 3, which is a flowchart 300 in accordance with an embodiment for simulating application of makeup performed by the computing device 102 of FIG. 1. It is understood that the flowchart 300 of FIG. 3 provides merely an example of the different types of functional arrangements that may be employed to implement the operation of the various components of the computing device 102. As an alternative, the flowchart 300 of FIG. 3 may be viewed as depicting an example of steps of a method implemented in the computing device 102 according to one or more embodiments.

Although the flowchart 300 of FIG. 3 shows a specific order of execution, it is understood that the order of execution may differ from that which is depicted. For example, the order of execution of two or more blocks may be scrambled relative to the order shown. Also, two or more blocks shown in succession in FIG. 3 may be executed concurrently or with partial concurrence. It is understood that all such variations are within the scope of the present disclosure.

In block 310, the user interface component 106 in the computing device 102 retrieves predefined cosmetic templates 110 from the data store 108 and presents a user interface displaying the various cosmetic templates 110 for the user to select from. In some instances, the user interface can display a series of thumbnails depicting the user with the various cosmetic templates 110 applied to the user's facial region. In other instances, the user interface can display a series of thumbnails depicting other individuals (for example, celebrities) with the various cosmetic templates 110 applied to the user's facial region. Each cosmetic template 110 comprises a predefined sequence for applying cosmetic effects.

In block 320, the user selects a desired cosmetic template 110 utilizing the user interface. In some instances, the selected cosmetic template 110 defines a specific sequence of steps for achieving the desired cosmetic effect.

In block 330, the user also specifies whether the user wishes to have the makeup applied to a still image of the user or to a live video of the user. Through the use of the digital content recording capabilities of the computing device 102, a virtual mirror is presented to the user whereby the user experiences the simulated application of makeup while viewing real time images of the user's face. Specifically, the virtual mirror displays progressive application of each of the sequence of cosmetic effects of the selected cosmetic template 110 to corresponding facial features in the digital representation.

Figure 4:
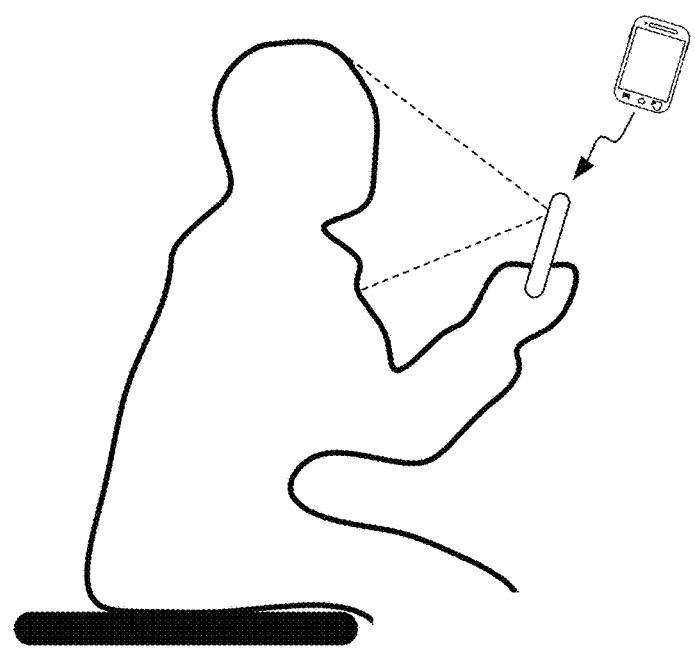
FIG. 4 illustrates the user holding the computing device whereby a front-facing camera on the computing device captures a live video of the user's face.

Reference is made briefly to FIG. 4, which illustrates one possible implementation of the virtual mirror utilizing a portable computing device 102 equipped with a front-facing camera that captures a digital representation of the user. The user interface component 106 provides frequent feedback to the user during the sequenced application of cosmetic effects and directs the user to reposition her face or to remain still in the event that the facial feature analyzer 114 is unable to accurately track the location of target facial features.

Referring back to FIG. 3, the process continues to block 340, where the facial feature analyzer 114 tracks the location of target facial features associated with the selected cosmetic template 110. For example, the target facial features may comprise, the user's eyes, eyebrows, lips, cheeks, and so on. In block 350, the user interface component 106 generates step-by-step directions for the user while applying the sequence of cosmetic effects defined in the cosmetic templates 110. The directions may comprise text shown on the display of the computing device 102, verbal directions, and/or graphical cues shown on the display. For example, arrows may be displayed on the computing device 102 to illustrate the direction in which a cosmetic product is being applied.

In block 360, once the sequence of cosmetic effects specified in the selected cosmetic template 110 has been applied, the final result is stored for later viewing by the user. Thereafter, the process in FIG. 3 ends.

Figure 5:
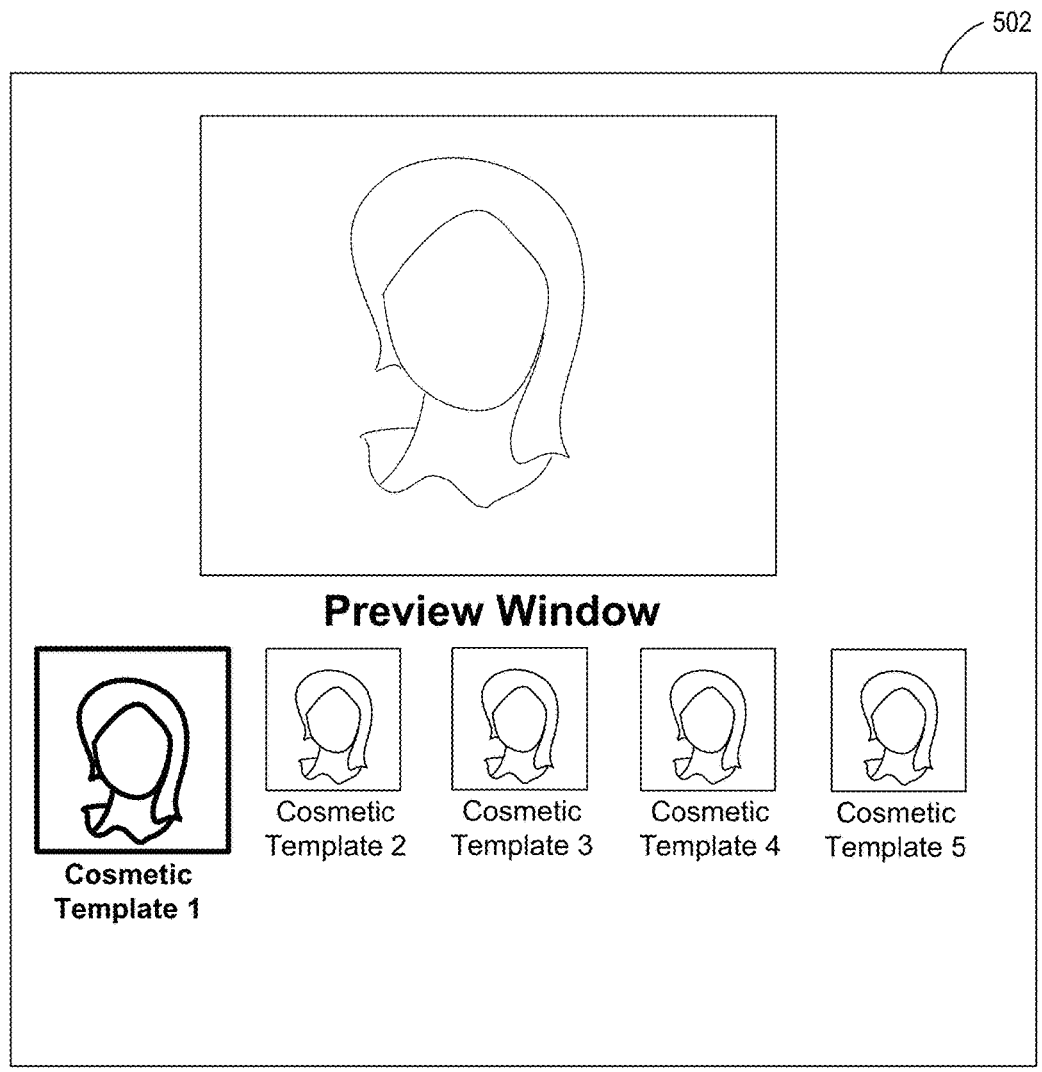
FIG. 5 illustrates the selection process where the user selects a desired cosmetic template in accordance with various embodiments.

To further illustrate various features, reference is made to FIG. 5, which illustrates the selection process in which the user selects a desired cosmetic template 110. Representative images of individuals with final cosmetic templates 110 applied may be shown to the user in a user interface 502. Note that the representative images may be of the user or of another individual(s). In the illustration shown, the user selects cosmetic template 1.

Figure 6A:
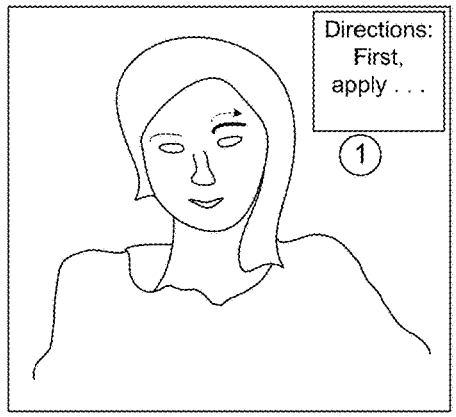
FIGS. 6A and 6B illustrate how step-by-step directions are provided to the user during the application of makeup in accordance with various embodiments.
Figure 6A:
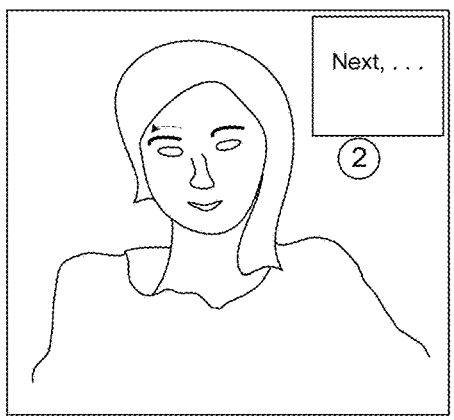
Figure 6A:
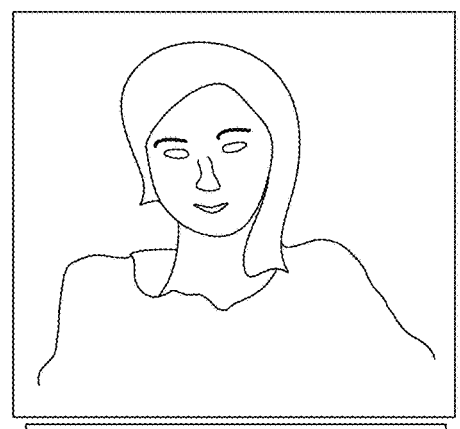
Figure 6B:
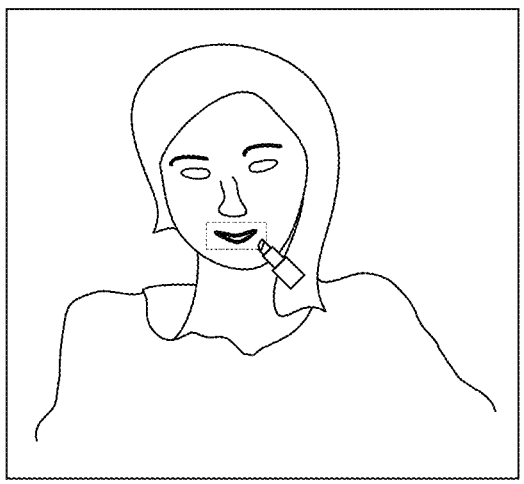

FIG. 6A illustrates an example where a first cosmetic template 110 (e.g., application of an eyebrow cosmetic) is applied. As shown, the user interface provides step-by-step directions on how to apply the cosmetic template 110. In the example shown, the cosmetic product is applied to a digital representation comprising live video of the user, thereby providing a virtual mirror effect where the end result of the cosmetic template 110 is achieved by superimposing the cosmetic effect onto the digital representation of the user. Furthermore, application of the cosmetic effect is shown in a specific sequence as the cosmetic template 110 is being applied to a particular facial feature. At the bottom, retailer information provides the user with information on where the particular cosmetic product being applied may be obtained. FIG. 6B illustrates an example where a second cosmetic product (e.g., lipstick) in the predefined sequence is applied.

Figure 7:
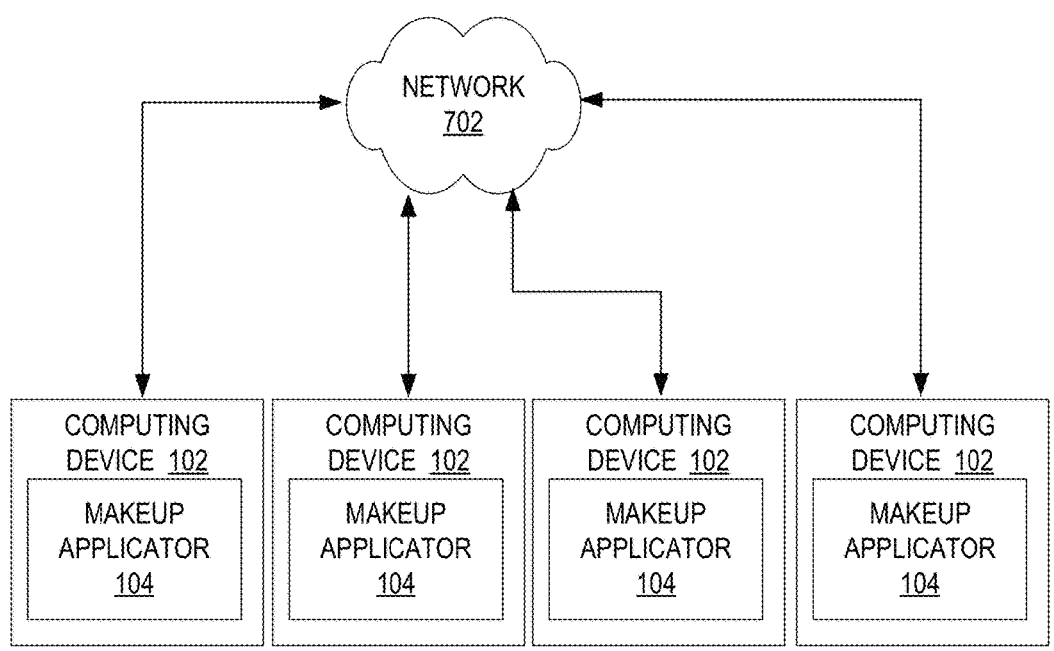
FIG. 7 illustrates multiple computing devices coupled together over a network in accordance with various embodiments.
Figure 8:
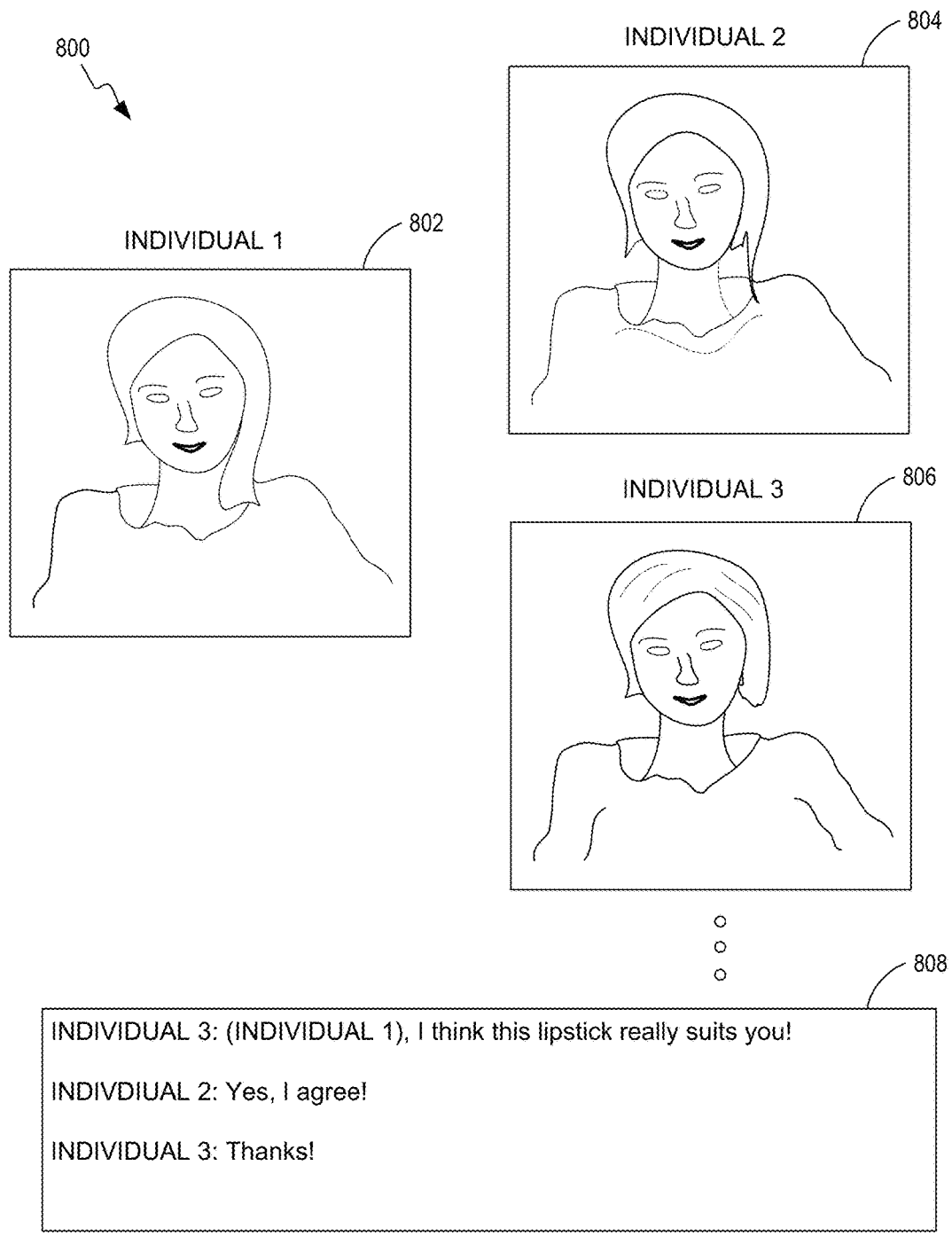
FIG. 8 illustrates an example user interface whereby windows corresponding to each of the users are shown in accordance with various embodiments.

In some embodiments, a social networking feature is incorporated whereby multiple computing devices 102 may be communicatively coupled together over a network 702, as shown in FIG. 7. In accordance with such embodiments, the cosmetic effects may be applied to users at the same time, where the users interact during the makeup application session. To illustrate, reference is made to FIG. 8, which illustrates an example user interface 800 whereby windows 802, 804, 806 corresponding to the respective users are shown. The user interface 800 also includes a messaging component 808, which allows the users to communicate during the session.

Figure 9:
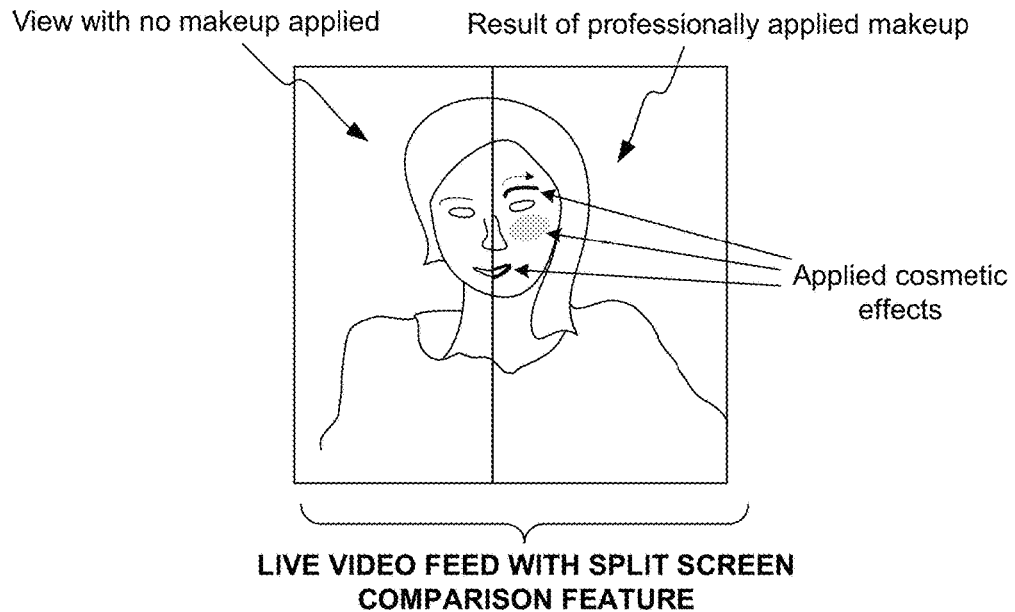
FIGS. 9 and 10 illustrate the use of a split screen comparison feature utilized while guiding a user during the makeup application process in accordance with various embodiments.
Figure 10:
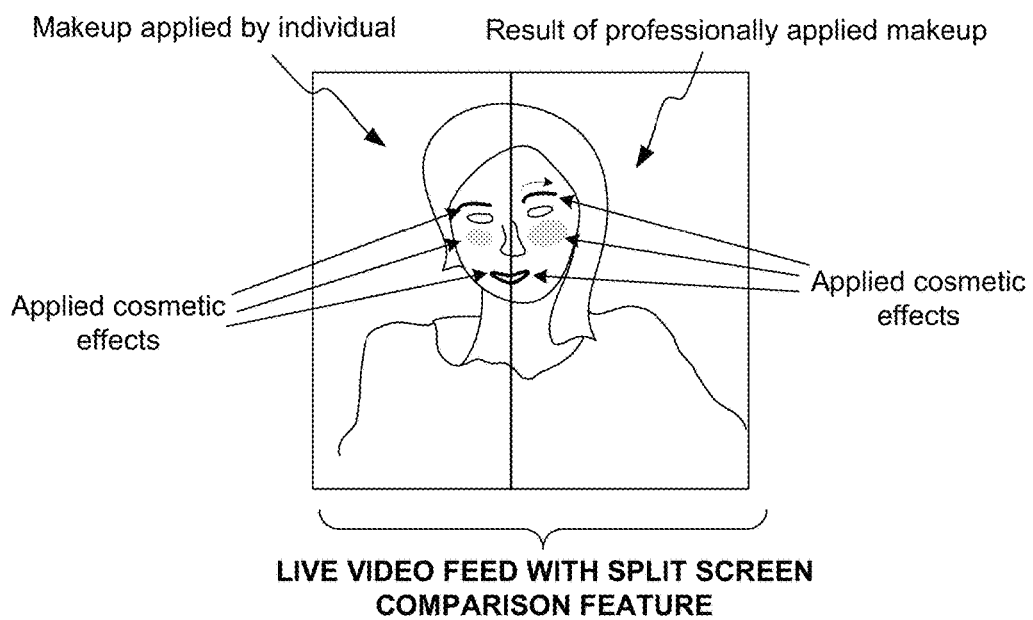

FIGS. 9 and 10 illustrate the use of a split screen comparison feature utilized while guiding a user during the makeup application process. In some embodiments, the makeup system includes a virtual mirror feature whereby the user is able view a still image or a live video of the user during the step-by-step application of cosmetic effects. The simulated application of makeup is achieved by superimposing cosmetic effects (e.g., lipstick) onto facial features of the user where object tracking is applied to track the various facial features. Note that in the context of this disclosure, discussion relating to professionally applied makeup refers to makeup applied by a professional, where the makeup is embodied as graphical effects applied to a digital representation of the user's face.

FIG. 9 shows one implementation whereby a split screen display is provided to allow the user to view the results of professionally applied makeup compared to a digital representation of the user with no makeup on, thereby providing a "before and after" comparison. In the example user interface shown in FIG. 9, the right half of the split screen display shows the result of professionally applied makeup whereas the left half shows the user with no makeup on.

FIG. 10 shows another implementation whereby a split screen display is provided to allow the user to view the results of professionally applied makeup compared to a digital representation showing the user's own attempt at applying the same makeup while following the onscreen directions (not shown) accompanying that particular step in the makeup sequence. Note that in this instance, the user is applying actual makeup to the face. This allows the user to more closely mimic the makeup application process being displayed.

In some embodiments, a live video of the user is captured while the user actually applies makeup according to the onscreen directions. In some embodiments, a digital representation of the user is captured prior to the application of any cosmetic effect. This digital representation is then utilized for the right half of the split screen display so that simulated cosmetic effects may then be superimposed onto the digital representation of the user.

Figure 11:
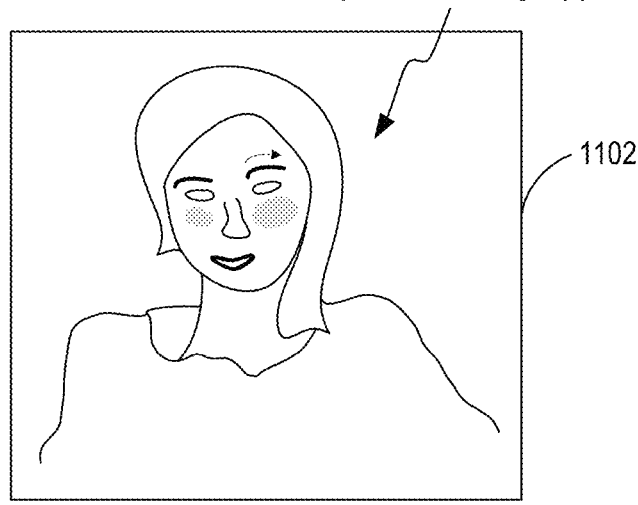
FIG. 11 illustrates a dual display configuration in accordance with various embodiments.
Figure 11:
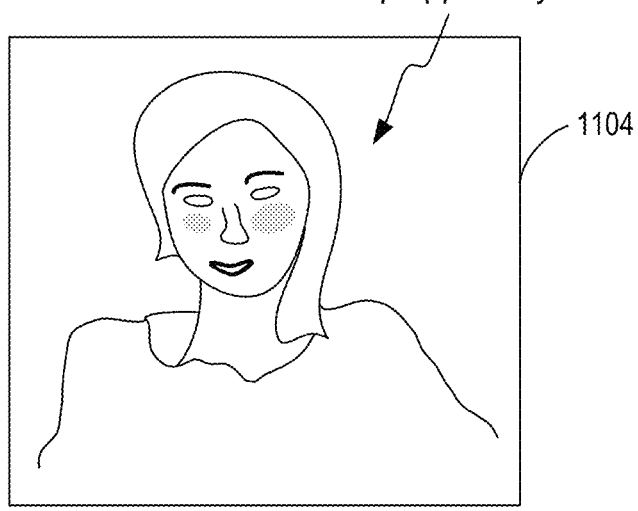

FIG. 11 illustrates a dual display configuration in accordance with various embodiments. In some implementations, the virtual mirror can comprise a dual display configuration. A first display 1102 shows the simulated application of each cosmetic effect on a digital representation of the user, where the digital representation is captured prior to application of any makeup effect. A second display 1104 corresponds to the actual application by the user of each cosmetic effect to the user's face.

Figure 12:
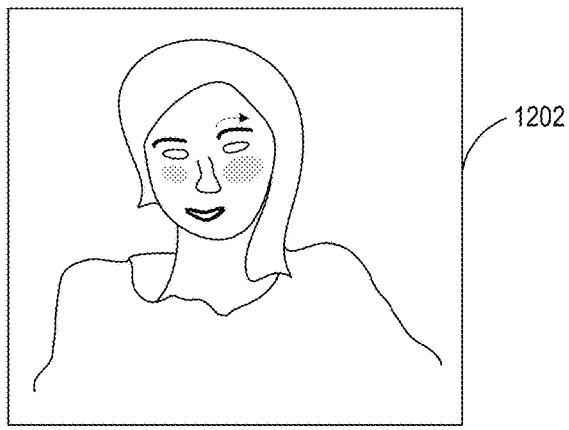
FIG. 12 illustrates an implementation of the dual display configuration in FIG. 11 with a toggle control in accordance with various embodiments.
Figure 12:
Figure 12:
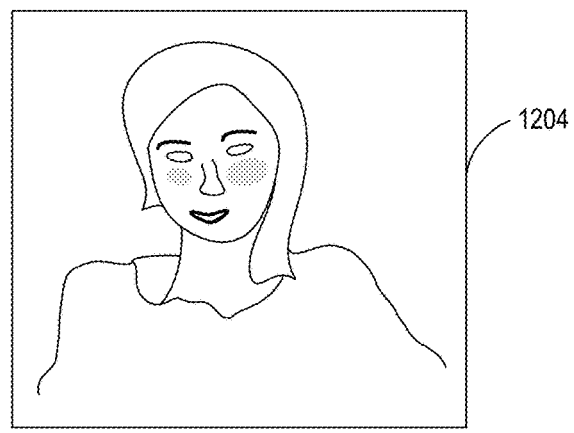

FIG. 12 illustrates an implementation of the dual display configuration in FIG. 11 with a toggle control in accordance with various embodiments. Specifically, the user interface shown in FIG. 12 is a variation of the dual display configuration whereby the user can toggle between two displays 1202, 1204. The first display 1202 shows the simulated application of each cosmetic effect on a digital representation of the user, where the digital representation is captured prior to application of any makeup effect. The second display 1204 corresponds to the actual application by the user of each cosmetic effect to the user's face. In the implementation shown in FIG. 12, only a single display is shown at a time, where the user can toggle between views use a control 1203, 1205. In yet another implementation of the dual display configuration in FIG. 11, the first display 1202 is shown by default. When the user begins to apply makeup, the system automatically shows the second display 1204.

Figure 13:
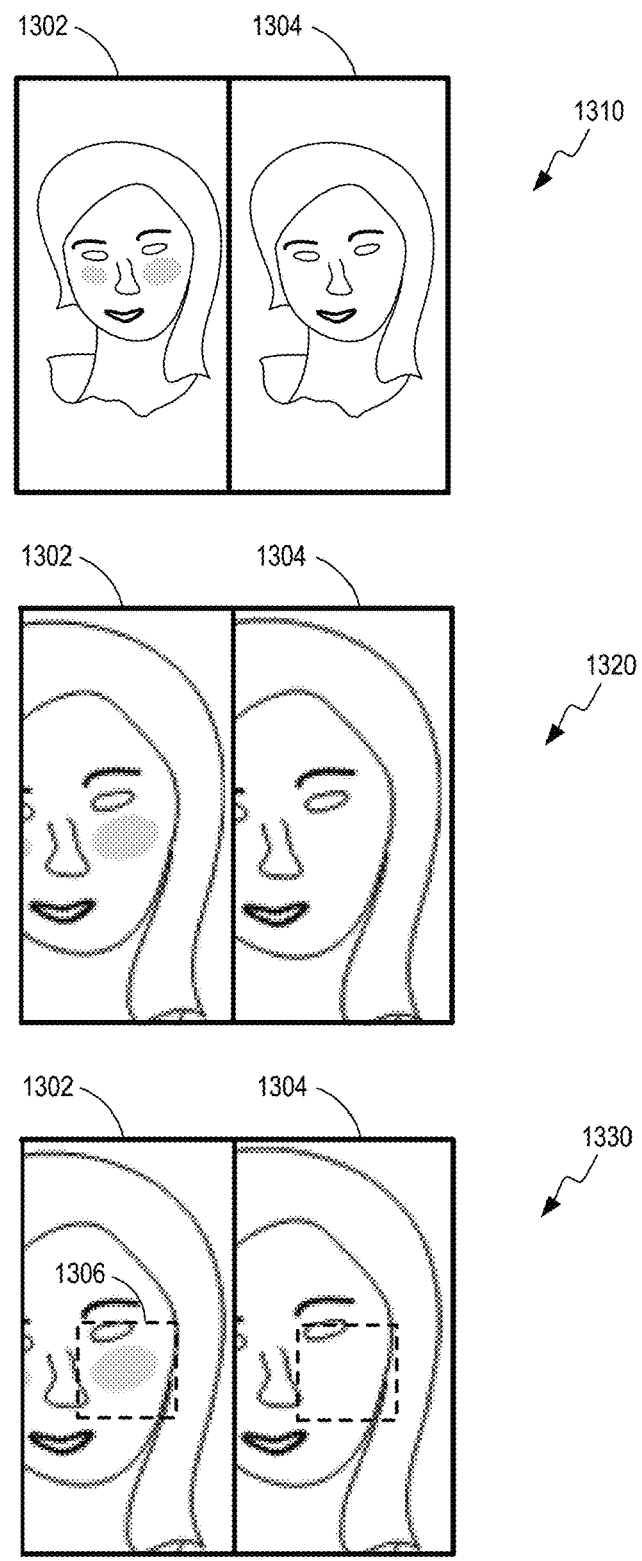
FIG. 13 illustrates another implementation of a split screen display configuration in accordance with various embodiments.

FIG. 13 illustrates a split screen configuration in accordance with various embodiments. In the split screen configuration shown, two displays 1302, 1304 are presented in a side-by-side mode for purposes of providing the user with a direct comparison between a display 1302 depicting the result of professionally applied makeup on the user's face and a display 1304 depicting the user with no makeup. This allows the user to view the differences between the user's face depicted in the digital representation and actual application of makeup by the user. In the implementation shown, the same region of the face is shown in the two displays 1302, 1304.

Note that the split screen implementation of FIG. 13 differs from the split screen implementation of FIG. 9 as each display in FIG. 9 shows one half of the user's face whereas in FIG. 13, each display focuses on the same region of the user's face in which makeup is being applied. For example, each of the displays 1302, 1304 in FIG. 13 is currently displaying the cheek region of the user's face. In the first example 1310 shown in FIG. 13, the user's entire face is shown in both displays 1302, 1304, whereas in the second example 1320 shown, a zoomed in view is provided whereby only a portion of the user's face is shown in both displays 1302, 1304. In the third example 1330 shown, a box 1306 is shown superimposed on the user's face for purposes of indicating to the user the current facial feature/region of interest where makeup is currently being applied.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

At least the following is claimed:

1. A method implemented in a computing device for simulating application of cosmetic effects, comprising:
    displaying, by the computing device, a user interface with a plurality of cosmetic templates to a user, each cosmetic template comprising a predefined sequence for applying cosmetic effects;
    obtaining, by the computing device, a selection of one of the cosmetic templates from the user;
    capturing, by the computing device, a digital representation comprising live video of the user;
    tracking, by the computing device, facial features of the user in the digital representation of the user;
    generating, by the computing device, a virtual mirror for the user to view, the virtual mirror displaying progressive application of each of the sequence of cosmetic effects of the selected cosmetic template to corresponding facial features in the digital representation, wherein the virtual mirror comprises a split screen display, wherein a first half of the split screen shows a live video of simulated application of virtual cosmetic effects to the user's face depicted in the digital representation, and wherein the second half of the split screen shows a live video of the user's face during the application by the user of actual cosmetic effects to the user's face; and
    storing, by the computing device, a digital representation of the simulated application of all of the sequence of cosmetic effects.

2. The method of claim 1, wherein the virtual mirror further displays at least one of: retailer information relating to a cosmetic product associated with each cosmetic effect in the sequence, and color information relating to the cosmetic product.

3. The method of claim 1, wherein displaying, by the computing device, the user interface with the plurality of cosmetic templates to the user further comprises displaying a preview window depicting a post-makeup result with the selected cosmetic template applied to the user's face.

4. The method of claim 1, wherein the virtual mirror further displays instructions guiding the user how to apply each of the sequence of cosmetic effects of the selected cosmetic template to corresponding facial features.

5. The method of claim 4, wherein the instructions comprise at least one of: text displayed on portions of the user's face, annotation, animation, step-by-step directions, information relating to color intensity of one of more of the cosmetic effects within the sequence of cosmetic effects, and text describing target facial regions for applying each of the sequence of cosmetic effects.

6. The method of claim 4, wherein the first half of the split screen displays one of a right side or a left side of the user's face depicted in the digital representation, and wherein the second half of the split screen displays the other of the right side or the left side of the user's face.

7. The method of claim 6, wherein the two halves of the split screen display are shown side by side to provide the user with a comparison between the simulated application of each cosmetic effect and the actual application by the user of each cosmetic effect.

8. The method of claim 1, wherein only one of the first display or the second display is shown at a time based on manipulation of a toggle control on the user interface.

9. The method of claim 1, wherein capturing the digital representation of the user comprises configuring a front facing camera of computing device to capture live video of the user.

10. A system, comprising:
    a memory storing instructions; and
    a processor coupled to the memory and configured by the instructions to at least:
        display a user interface with a plurality of cosmetic templates to a user, each cosmetic template comprising a predefined sequence for applying cosmetic effects;
        obtain a selection of one of the cosmetic templates from the user;
        capture a digital representation comprising live video of the user;
        track facial features of the user in the digital representation of the user;
        generate a virtual mirror for the user to view, the virtual mirror displaying progressive application of each of the sequence of cosmetic effects of the selected cosmetic template to corresponding facial features in the digital representation, wherein the virtual mirror comprises a split screen display, wherein a first half of the split screen shows a live video of simulated application of virtual cosmetic effects to the user's face depicted in the digital representation, and wherein the second half of the split screen shows a live video of the user's face during the application by the user of actual cosmetic effects to the user's face; and
        store a digital representation of the simulated application of all of the sequence of cosmetic effects.

11. The system of claim 10, wherein the virtual mirror further displays at least one of: retailer information relating to a cosmetic product associated with each cosmetic effect in the sequence, and color information relating to the cosmetic product.

12. The system of claim 10, wherein displaying the user interface with the plurality of cosmetic templates to the user further comprises displaying a preview window depicting a post-makeup result with the selected cosmetic template applied to the user's face.

13. The system of claim 10, wherein the virtual mirror further displays instructions guiding the user how to apply each of the sequence of cosmetic effects of the selected cosmetic template to corresponding facial features.

14. The system of claim 13, wherein the first half of the split screen displays one of a right side or a left side of the user's face depicted in the digital representation, and wherein the second half of the split screen displays the other of the right side or the left side of the user's face.

15. The system of claim 14, wherein the two halves of the split screen display are shown side by side to provide the user with a comparison between the simulated application of each cosmetic effect and the actual application by the user of each cosmetic effect.

16. A non-transitory computer-readable storage medium storing instructions to be implemented by a computing device having a processor, wherein the instructions, when executed by the processor, cause the computing device to at least:
   display a user interface with a plurality of cosmetic templates to a user, each cosmetic template comprising a predefined sequence for applying cosmetic effects;
   obtain a selection of one of the cosmetic templates from the user;
   capture a digital representation comprising live video of the user;
   track facial features of the user in the digital representation of the user;
   generate a virtual mirror for the user to view, the virtual mirror displaying progressive application of each of the sequence of cosmetic effects of the selected cosmetic template to corresponding facial features in the digital representation, wherein the virtual mirror comprises a split screen display, wherein a first half of the split screen shows a live video of simulated application of the user's face depicted in the digital representation, and wherein the second half of the split screen shows a live video of the user's face during the application by the user of actual cosmetic effects to the user's face; and
   store a digital representation of the simulated application of all of the sequence of cosmetic effects.

17. The non-transitory computer-readable storage medium of claim 16, wherein the first half of the split screen displays one of a right side or a left side of the user's face depicted in the digital representation, and wherein the second half of the split screen displays the other of the right side or the left side of the user's face.

18. A method implemented in a computing device for simulating application of cosmetic effects, comprising:
   displaying, by the computing device, a user interface with a plurality of cosmetic templates to a user, each cosmetic template comprising a predefined sequence for applying cosmetic effects;
   obtaining, by the computing device, a selection of one of the cosmetic templates from the user;
   capturing, by the computing device, a digital representation comprising live video of the user;
   tracking, by the computing device, facial features of the user in the digital representation of the user;
   generating, by the computing device, a virtual mirror for the user to view, the virtual mirror displaying progressive application of each of the sequence of cosmetic effects of the selected cosmetic template to corresponding facial features in the digital representation, wherein the virtual mirror comprises a split screen display, wherein a first half of the split screen shows a live video of simulated application of virtual cosmetic effects to the user's face depicted in the digital representation, and wherein the second half of the split screen shows a live video of the user's face without application of any cosmetic effect, wherein the virtual mirror further displays instructions guiding the user how to apply each of the sequence of cosmetic effects of the selected cosmetic template to corresponding facial features; and
   storing, by the computing device, a digital representation of the simulated application of all of the sequence of cosmetic effects.

* * * * *